United States Patent
Oshins et al.

(10) Patent No.: US 11,397,656 B2
(45) Date of Patent: Jul. 26, 2022

(54) TELEMETRY GENERATION FOR IN-FIELD HARDWARE TESTING

(71) Applicant: Microsoft Technology Licensing, LLC, Redmond, WA (US)

(72) Inventors: Jacob Kappeler Oshins, Seattle, WA (US); Hari Angepat, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 39 days.

(21) Appl. No.: 16/673,503

(22) Filed: Nov. 4, 2019

(65) Prior Publication Data

US 2021/0133069 A1 May 6, 2021

(51) Int. Cl.
| | |
|---|---|
| G06F 11/30 | (2006.01) |
| G06F 8/658 | (2018.01) |
| G06F 16/14 | (2019.01) |
| G06F 16/11 | (2019.01) |

(52) U.S. Cl.
CPC .......... G06F 11/3013 (2013.01); G06F 8/658 (2018.02); G06F 11/3006 (2013.01); G06F 16/119 (2019.01); G06F 16/144 (2019.01)

(58) Field of Classification Search
CPC .... G06F 11/3013; G06F 8/658; G06F 16/144; G06F 11/3006; G06F 16/119
See application file for complete search history.

(56) References Cited

U.S. PATENT DOCUMENTS

| | | | |
|---|---|---|---|
| 8,407,633 B2 | 3/2013 | Courchesne et al. | |
| 9,912,474 B2 | 3/2018 | Gupta et al. | |
| 10,102,108 B2 | 10/2018 | Araya et al. | |
| 10,324,436 B2 | 6/2019 | Oliverio et al. | |
| 10,339,032 B2 | 7/2019 | Kirbach et al. | |
| 2009/0276106 A1* | 11/2009 | Doan | G06F 11/3696 701/3 |
| 2016/0378628 A1* | 12/2016 | Nguyen | G06F 11/27 714/40 |
| 2017/0109259 A1 | 4/2017 | Lewis et al. | |
| 2018/0097829 A1 | 4/2018 | Muttik | |
| 2018/0285240 A1 | 10/2018 | Kou et al. | |
| 2019/0014193 A1 | 1/2019 | Guim Bernat et al. | |
| 2019/0250941 A1 | 8/2019 | Rooke et al. | |
| 2019/0385386 A1* | 12/2019 | Davidson | G07C 5/085 |
| 2019/0391833 A1* | 12/2019 | Muramatti | G06F 9/5061 |

FOREIGN PATENT DOCUMENTS

WO 2017066115 A1 4/2017

OTHER PUBLICATIONS

"International Search Report and Written Opinion Issued in PCT Application No. PCT/US20/057578", dated Feb. 16, 2021, 13 Pages.

* cited by examiner

*Primary Examiner* — Kim T Nguyen

(57) ABSTRACT

A system for capturing hardware telemetry includes a hardware component encoded with hardware logic for emitting a telemetry stream into memory of a computing device. The system further includes a hardware component driver stored in the memory that is configured to parse the telemetry stream, populate telemetry structures defined within a telemetry event schema based on values parsed from the telemetry stream, and generate a telemetry record including the populated telemetry structures.

19 Claims, 5 Drawing Sheets

TELEMETRY GENERATION FOR IN-FIELD HARDWARE TESTING

BACKGROUND

In recent years, traditional methods of software testing have been largely improved upon by the availability of cloud computing services that leverage pooled computing power of multiple machines to collect and aggregate performance information relating to software products that have already been deployed. A cloud-based data service may, for example, include hundreds to hundreds of thousands of computers, each running some version of a software product. Some of the computers may run less-proven versions of the software product while a larger percentage of the computers run better-proven, older versions. As a newer version of the software becomes more proven, it is deployed on a larger share of the machines. During this process, the computers executing the software product may continually generate and transmit error log information to a centralized aggregation server. The aggregated error log information allows software developers to continue to improve the software product and deploy new, better versions of the code.

Despite this shift toward cloud computing test environments for software, testing of hardware components remains largely unchanged. Hardware components are typically designed and tested to finalization in a lab before ever being integrated within a consumer computing device. However, certain programmable hardware components, such as programmable gate arrays (FPGAs), may benefit from the types of large-scale statistics that are currently collected during software tests on cloud-based computing nodes. While some existing hardware test technologies can be leveraged to observe hardware telemetry in select environments and/or capture massive amounts of telemetry data, current technologies do not provide any architectural mechanism for capturing select hardware telemetry values from integrated circuits (ICs) that have already been deployed in-the-filed (e.g., installed in the machines of end users) or for meaningfully interpreting such data without extensive, burdensome, and at times quantity-prohibitive manual efforts.

SUMMARY

According to one implementation, a method for in-field testing of a hardware component includes receiving, in a memory buffer of a computing device, a telemetry stream from a hardware component responsive to execution of hardware logic by the hardware component. Telemetry structures pre-defined within a telemetry event schema are populated based on values parsed from the telemetry stream, and a telemetry record including the populated telemetry structures is written to memory of the computing device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

DETAILED DESCRIPTION

Figure 1:
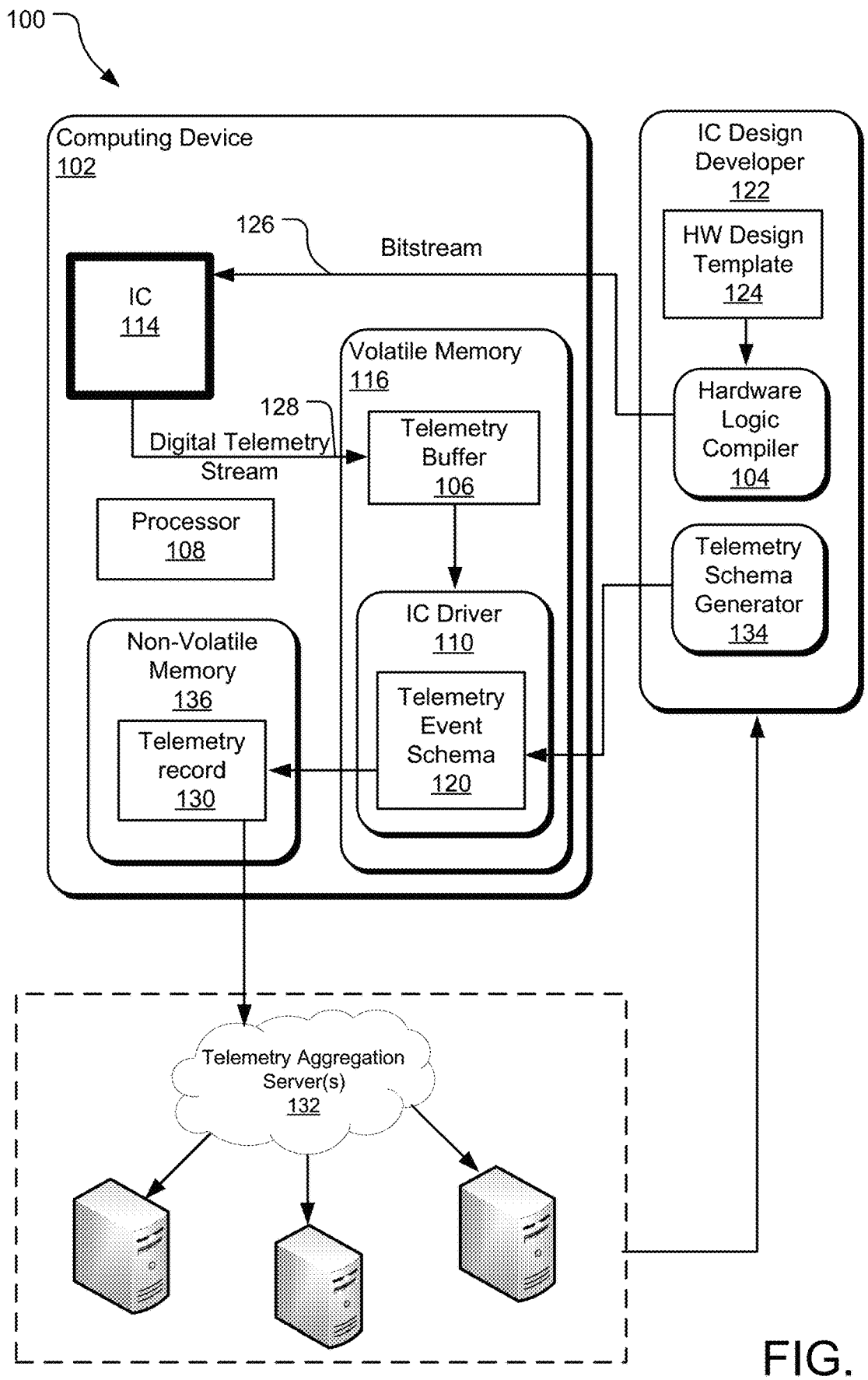
FIG. 1 illustrates an example system that creates telemetry logs of event data pertaining to execution of a hardware component.

Field-programmable gate arrays (FPGAs) are semiconductor devices that are based around a matrix of configurable logic blocks connected via programmable interconnects. FPGAs can be reprogrammed to desired application or functionality requirements after manufacturing. This feature distinguishes FPGAs from Application Specific Integrated Circuits (ASICs), which are custom manufactured for specific design tasks. Although one-time programmable FPGAs are available, the dominant types are SRAM based which can be reprogrammed as the design evolves.

In traditional testing of integrated circuits (IC) such as FPGAs and ASICs, a hardware developer constructs a gate-level schematic circuit and translates hardware logic of the design to a text-based representation of the circuit (e.g., a netlist) that is compiled into a binary format and downloaded into a simulator device coupled to the IC. The simulator provides the IC with test data patterns and records outputs of the IC, which are then manually observed by an operator. However, this approach has become less feasible as IC technology has advanced. For example, current FPGA designs can support more than 20 million equivalent gates, plus processor platforms and a range of communications, digital signal processing (DSP), and other functional blocks. The complexity of these components has made it both time and cost-prohibitive to exhaustively test this chips using a traditional simulator.

In some test scenarios, hardware developers use an embedded logic analyzers, (e.g., Signal-Tap®) to automatically capture and display signals within FPGA circuits. Unlike traditional simulation, these logic analyzers run in real hardware (not within a simulator) to provide the developer with outputs useful in debugging (e.g., waveforms of logic signals within the design). Due to the aforementioned complexity of FPGA circuits; however, these tools produce and capture a stunning amount of data (e.g., thousands of sampled voltages) that is, after the fact, used to reconstruct logical states that occurred in the FPGA. Consequently, outputs from these tools can be exceedingly difficult for a developer to comprehend and analyze.

The presently disclosed technology provides a framework for configuring a hardware component (e.g., a device that may operate functionally without executing software) with hardware logic for outputting a telemetry bit stream including telemetry values providing information pertaining to how the device is physically operating and what the device is doing. The herein disclosed systems and methods provide solutions that facilitate autonomously digesting the state of hardware logic (digital signals output from an IC) in a manner that facilitates a direct report of the logical states of the IC (hardware telemetry) to an end user.

In one implementation, a software device driver is generated for interpreting and capturing hardware telemetry data pertaining to functionality of an integrated circuit (IC) installed on a user machine. The software device driver is developed based on the same hardware logic that configures the hardware component to output a digital telemetry stream. When loaded into memory of a processing device including the hardware component, the driver may be executed by a processor to interpret the output telemetry stream, populate data fields (e.g., telemetry event data) of a telemetry database schema with values parsed from the telemetry bit stream, and write a telemetry record including the field tags and the associated populated field values. Due to the preservation of semantic information (e.g., a database schema that gives structure and meaning to the digital values captured within the output telemetry stream), hardware telemetry for a single configuration of the hardware device can be collected from multiple (e.g., thousands) of different devices and aggregated, statistically processed, and used to further design efforts.

The above-described methodology effectively allows for wide-scale, in-the-field testing of hardware components similar to current in-the-field methods for software deployment. For example, the presently-disclosed methodology may allow for extensive testing of a hardware configuration across hundreds or thousands of devices that may utilize the hardware component in different ways and/or within different environments. For programmable ICs such as FPGAs, the telemetry data can be used to inform the development of hardware logic upgrades (e.g., patches) that may be used to reconfigure the FPGAs to improve functionality of the deployed designs.

FIG. 1 illustrates an example system 100 that creates telemetry logs of event data pertaining to execution (e.g., health, safety, and housekeeping data) of a hardware component (e.g., an integrated circuit (IC) 114). Although the disclosed technology may provide particular advantages for re-programmable ICs (e.g., Field Programmable Gate Arrays (FPGAs)) that may be de-bugged and updated in-the-field, it should be understood that aspects of the disclosed technology may be utilized in connection with any type of IC for which telemetry capture is useful (e.g., ongoing research and development of chip designs).

Although the IC 114 may, in various implementations, be any type of integrated circuit, the IC 114 is shown to be a reprogrammable chip (e.g., a FPGA) that is capable of being re-programmed after it is deployed in-the-field on a computing device 102 (within the computing environment of an end user. Example programming of the IC 114 is illustrated in FIG. 1. Here, an IC design developer 122 generates a hardware design template 124 that provides an algorithmic description of desired behavior for the IC 114. In one implementation, the hardware design template 124 defines content that is to be captured on the IC 114 and emitted as a first-in, first-out (FIFO) structure that is moved off the IC 114 and into memory (e.g., volatile memory 116). The hardware design template 124 is instantiated to create a class instance that is, in turn, compiled by a hardware logic compiler 104 to generate the bitstream 126 that is deployed to a user computer (e.g., computing device 102). When loaded onto the IC 114, the bitstream 126 physically configures the electrical components (e.g., various shift registers and look-up tables) within the IC 114 to implement the behavior algorithmically described by the hardware design template 124

As will be discussed in further detail with respect to the following figures, the hardware design template 124 may be instantiated with respect to one or more telemetry structure record definitions to cause the IC to output 114 a digital telemetry stream 128 that consists of digital signals associated with the telemetry record structure definitions. A developer may, for example, define hardware telemetry records of interest using a high-level database scheme language that defines representations that can then be carried out in other languages. For example, Bond or Protocol buffers may be utilized to define telemetry record structures of interest and the hardware design template 124 may be instantiated to act on one or more of the defined telemetry record structures to generate a class instance. Compilation of the class instance generates a bitstream 126 that may be loaded onto the IC 114 to cause the IC 114 to output digital signals usable to infer logical states (field values) of those telemetry record structures.

As used herein, the term "telemetry record" is intended to refer to the various logical states that exist in association with observed digital signals collected from within a hardware component. Digital signals may, for example, refer to sampled voltages at different sampling points within the IC. The observance of certain digital signals may imply that certain logical states are true or not true. For example, a set combination of observed voltages may be usable to infer that the IC is currently executing a particular function. In contrast to digital signals, a telemetry record references the logical states of the IC, such as by identifying processing operations that the IC executing rather than merely reporting the observed digital signals.

According to one implementation, the IC design developer 122 instantiates a telemetry pipeline that provides instructions for analyzing a series of digital signals and digesting them into a telemetry record (e.g., a telemetry record 130) including the inferred logical states of the IC 114. The telemetry pipeline additionally includes logic to decide, based on other digital signals, whether the telemetry record should be emitted, allowing the IC design developer 122 to reduce the number of emitted records by encoding policy about when those records are interesting enough to preserve.

In addition to providing the computing device 102 with the bitstream 126 generated from the hardware design template 124, the IC design developer 122 also uses a telemetry schema generator 134 to generate a telemetry event schema 120 based on the hardware design template 124. The telemetry event schema 120 is, for example, a schema that preserves semantic data pertaining to telemetry records defined in the HW design template 124, including their fields, functions, dependencies, etc. The telemetry event schema 120 includes processor-executable instructions for parsing the digital telemetry stream 128 to analyze the digital signals and, from those digital signals, for inferring field values (logical states) of the telemetry structures used to generate the bitstream 126.

When the IC 114 executes the hardware logic programmed via the bitstream 126, the IC 114 outputs the resulting digital telemetry stream 128 into a telemetry buffer 106 in volatile memory 116 (e.g., RAM) of the computing device 102. For example, the digital telemetry stream 128 is emitted from the IC 114 as a FIFO, and the telemetry buffer 106 that receives the FIFO may be a circular buffer. In other implementations, the telemetry buffer 106 is a non-circular buffer. For example, telemetry buffer 106 may manage a free list of entries allocated to telemetry records based on event categories and this data may be migrated to more permanent storage locations in an order dictated by relative priority or criticality of the records (e.g., first-in, any out). In another implementation, the telemetry buffer 106 manages a scratchpad to hold a block of entries that are then jointly migrated to more permanent storage locations (e.g., first-in, all out).

As the digital telemetry stream 128 is written to the telemetry buffer 106, the IC driver 110 reads and interprets the bits in the digital telemetry stream 128 by using the telemetry event schema 120, which includes information for identifying the pre-defined data structures and fields corresponding to the various digital bits within the digital telemetry stream 128. The IC driver 110 parses the telemetry buffer 106 and populates fields in the telemetry event schema 120 based on identified corresponding digital values parsed from the digital telemetry stream 128.

Data of the populated telemetry event schema 120 is then written to a telemetry record 130 which is, in the example of FIG. 1, stored in non-volatile memory 136 (e.g., disk or SSD-based storage) of the computing device 102. In other implementations, the telemetry record 130 may be transmitted to one or more remote permanent storage locations instead of or in addition to being locally saved on the locally on the computing device 102.

In the illustrated implementation, the IC driver 110 transmits the telemetry record 130 to one or more cloud-based servers (e.g., telemetry aggregation server(s) 132) where the data is stored, aggregated, processed, and/or analyzed to provide statistical information pertaining to performance of the IC 114 in various different instances of chip implementation across many different processing devices. Aggregated hardware telemetry data are then stored in the telemetry aggregation servers 132 which may, in turn, be queried by the IC design developer 122 and accessed to provide statistical information that may inform a redesign of or update to (e.g., patch) the hardware logic programmed on the IC 114 via the bitstream 126. For example, analyzing telemetry records across a variety of machines can be used to infer which disks or network paths may be overloaded, slow, exhibiting signs of degradation, etc.

In some cases where the IC 114 is not re-programmable (e.g., the IC 114 is an ASIC), the IC 114 is initially programmed with the telemetry capture logic during a factory initialization process, and the programmed logic remains unchanged within the IC 114 throughout its usable lifetime. Even in these cases, telemetry data captured and stored in the telemetry aggregation servers 132 may be used to inform the manufacturer, hardware designer, or other parties about the functioning of the chip, such as to inform the development efforts for future-released chip designs.

Figure 2:
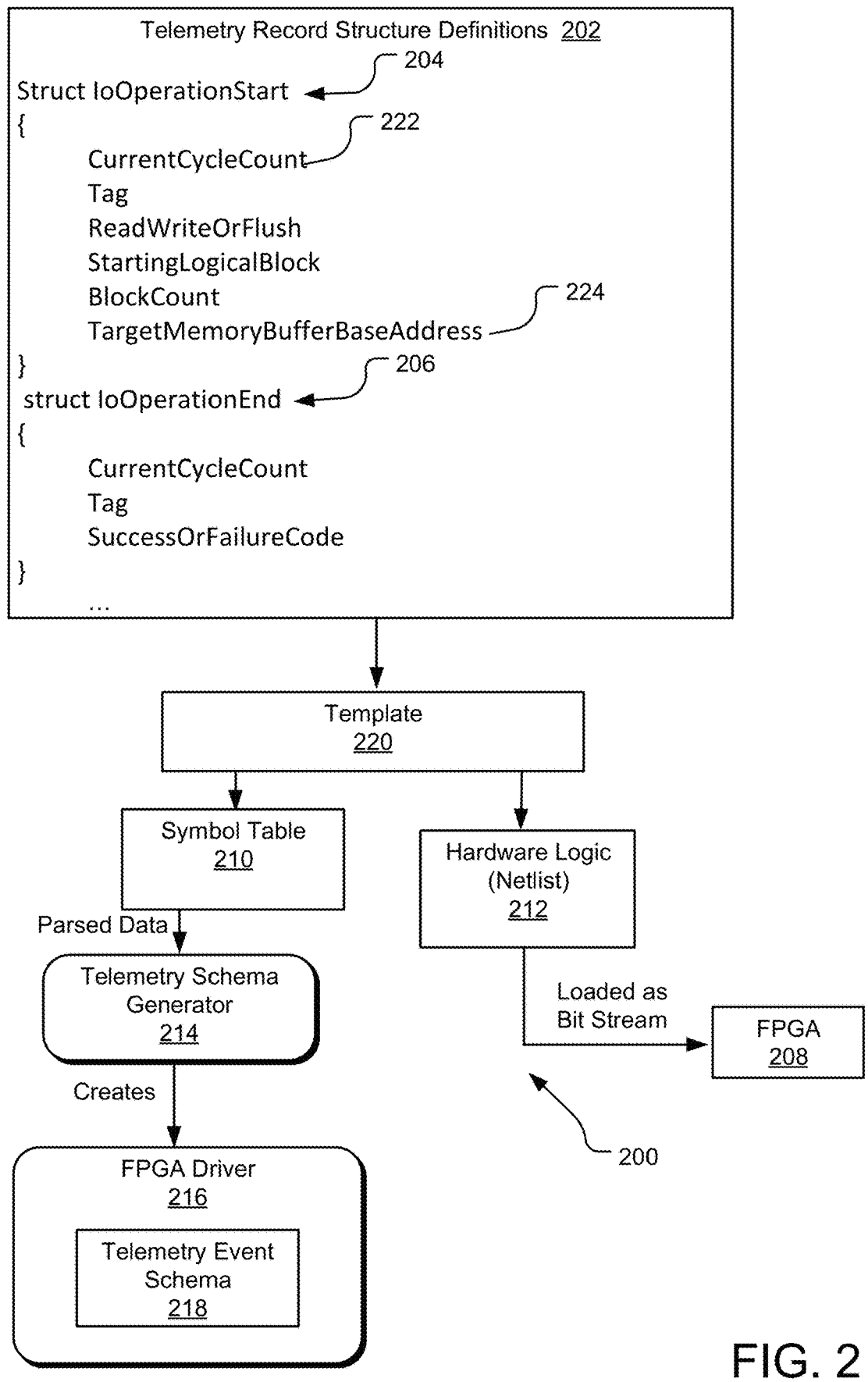
FIG. 2 illustrates an example system for generating and processing telemetry for an in-field hardware component.

FIG. 2 illustrates an example system 200 for generating and processing telemetry for a hardware component. Specifically, the system 200 is shown performing operations for programming an IC (e.g., FPGA 208) to output a digital telemetry stream and for building a driver (e.g., FPGA driver 216) capable of interpreting the digital telemetry stream to infer corresponding logical state information on a user computing device. In FIG. 2, the IC is shown to be an FPGA 208; however, the IC may assume other forms in different implementations.

During an initial design operation, a developer drafts one or more telemetry record structure definitions 202 defining telemetry structures of interest. For example, telemetry record structure definitions 202 may be written using tools such as Bond or Protocol Buffers that define representations that can then be carried out in other languages. By example and without limitation, the telemetry record structure definitions 202 include telemetry structures 204, 206 that are each further defined by fields such as fields 222 and 224. The developer also creates a template 220 that may be instantiated to act on the telemetry structures 204, 206 to generate a corresponding hardware logic 212 (e.g., a bitstream) that may be loaded onto the FPGA 208.

In one implementation, the template 220 defines a record (e.g., a FIFO) that is to be emitted by the FPGA 208. Digital signals to be included in the emitted record depend on the telemetry structure (e.g., 204 or 206) used to instantiate the template 220. This emitted record includes digital signal information usable to infer logical states of the associated defined telemetry structure 204 or 206.

In general, the telemetry record structure definitions 202 and template 220 collectively define a high-level schema usable to define, capture, and interpret a set of semantically interesting data records that may help a hardware designer understand what the FPGA 208 is processing. The types of telemetry records defined within the telemetry record structure definitions 202 may vary dramatically depending on the purpose for which the FPGA 208 is being used. By example and without limitation, the telemetry structures 204 and 206 define the start and end of an IO operation. Telemetry records associated with these events may, for example, be useful when the FPGA 208 is to be programmed to act as a storage controller. In the example of FIG. 2, the telemetry structures 204, 206 each include a number of fields (e.g., fields 222, 224) that include the current cycle count, a tag indicating the type of telemetry event that has occurred (e.g., "IoOperationStart"), the type of I/O operation (e.g., write, read, flush), the LBA start of the operation, and the length of the operation. By example and without limitation, these example fields represent logical state information that may be inferred based on digital signal values output by the FPGA 208 each time the FPGA 208 performs actions associated with the defined telemetry event (e.g., each time a new I/O operation begins or ends). Other telemetry events may vary dramatically depending upon the nature for which the FPGA 208 is used.

In various implementations, the template 220 may be generated in either a high-level synthesis language (e.g., Catapult-C' from Mentor Graphics or 'Vivado HLS' from Xilinx) or a lower-level hardware description language (e.g., Verilog). When the template 220 is instantiated with one or more of the telemetry record structure definitions 202 and compiled by a compiler (not shown), the compiler generates the hardware logic 212 (sometimes referred to as a "Netlist") as well as a hardware bitstream symbol table 210.

As explained above, the hardware logic 212 includes the requisite information for programming the FPGA 208 to output a telemetry stream including digital signal values associated with the telemetry structures 204, 206 used to instantiate the template 220. In one example implementation, the hardware logic 212 defines a FIFO that receives digital signal information associated with a defined telemetry structure each time the associated telemetry event occurs. The hardware logic 212 may also define the hardware logic for writing a record into memory (e.g., RAM) that contains data that is placed in the FIFO.

The hardware bitstream symbol table 210 stores names and related logical state information (e.g., function names, objects, classes etc.) for all defined telemetry structures acted upon when the template 220 is instantiated. A telemetry schema generator 214 is executed by a processor to parse the hardware bitstream symbol table 210 to autogenerate code (e.g., an FPGA driver 216) that interprets the digital telemetry stream generated by the FPGA 208 as the hardware logic 212 is executed.

Because the telemetry structures 204, 206 and template 220 are defined in a high-level schema, the telemetry schema generator 214 may use such information to construct a similar telemetry event schema 218 within the FPGA driver 216 and to autogenerate code that can populate the telemetry event schema 218 based on the information that appears in the digital telemetry stream output by the FPGA 208. For example, the FPGA driver 216 may be programmed to identify each different type of digital telemetry value written into RAM (e.g., each bit in the digital telemetry stream 128), and semantically tag those values in association with corresponding fields defined in the telemetry event schema 218. Stated differently, the FPGA driver 216 includes the telemetry event schema 218 and instructions for populating the telemetry event schema 218 schema and its associated field values (logical states) based on the digital telemetry stream output by the FPGA 208. This populated schema may be stored within a telemetry record in a permanent storage location, such as local or remote disk or SSD-based storage. In one implementation, the telemetry record is migrated into a big data analysis system, such as Azure Data Lake Services, which allows for sophisticated data aggregation and analysis of large numbers of records.

In the above-described system, use of the pre-defined telemetry event schema 218 allows new types of telemetry events to be added to the telemetry stream and stored at very low cost, simply by updating the schema and hardware logic.

Figure 3:
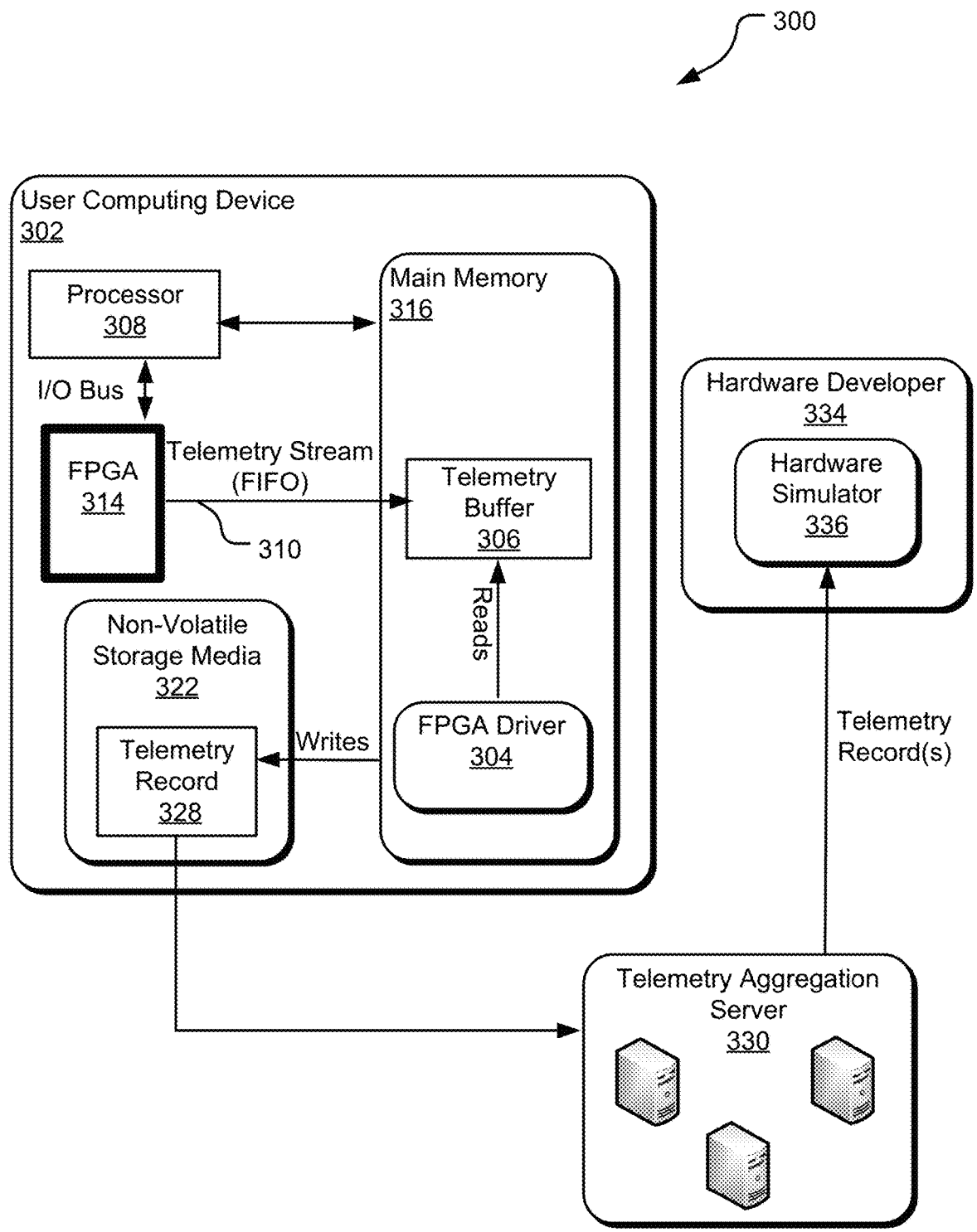
FIG. 3 illustrates another example system for capturing in-field telemetry pertaining to performance of an integrated circuit chip.

FIG. 3 illustrates another example system 300 for generating and capturing in-field telemetry pertaining to performance of an IC chip. The system 300 includes a user computing device 302 that includes an FPGA 314 programmed with hardware logic for emitting a digital telemetry stream 310 as a FIFO that is placed into a telemetry buffer 306 in main memory (RAM) of the user computing device 302. The user computing device 302 includes a processor 308 that communicates with the FPGA 314 over an I/O bus. Although FIG. 3 illustrates the telemetry stream 310 as being written from the FPGA 314 directly into the telemetry buffer 306, some implementations may write the telemetry stream 310 to the telemetry buffer 306 by first routing the telemetry stream 310 over the I/O bus 318 to the processor 308 and then along a channel between the processor 308 and the main memory 316.

The user computing device 302 includes an FPGA driver 304 loaded into the main memory 316 that is executable by the processor 308 to interpret the telemetry stream 310 output by the FPGA 314. According to one implementation, the FPGA driver 304 is executable to collect the digital telemetry stream 310 from the telemetry buffer 306, parse the telemetry stream for specific digital telemetry values corresponding to predefined telemetry records of interest, populate fields (logical states) of the telemetry event schema with the identified corresponding values, and write a telemetry record 328 to non-volatile memory of the user computing device 302 that includes the populated telemetry event schema. The FPGA driver 304 may be further executable to periodically or upon request migrate the telemetry record 328 to a telemetry aggregation server 330 that receives other, similar telemetry records from other user computing devices that also include FPGAs programmed with the same hardware logic.

A hardware developer 334 may query the telemetry aggregation server 330 to request telemetry event data usable to troubleshoot problems (bugs) with the hardware logic of the FPGA 314. In some implementations, problems may be understood merely by querying and analyzing data from the stored telemetry event logs. In other cases, the hardware developer 334 may feed the telemetry event log records into a hardware simulator 336 that is usable to simulate the hardware logic loaded onto the FPGAs. Although the simulations may be slow, the hardware simulator 336 may allow the hardware developer 334 to observe the state of related components of the FPGA that are associated with each telemetry event defined in the telemetry records (e.g., by effectively observing voltage values at specific gates associated with each defined telemetry event). The collection and use of telemetry records 328 in this way effectively allows the hardware developer 334 to re-simulate and understand problems that arise on ICs deployed in-the-field. Using such information, the hardware developer may identify changes to the hardware logic that fix such problems, update the hardware logic accordingly, and make the updated logic available for download and installation on user computing devices.

In one implementation, the hardware simulator 336 is enhanced to show telemetry event data from the telemetry record(s) 328 in association with each observed simulation state of the FGPA hardware logic. The hardware simulator 336 may compare the log record data (e.g., actual outputs of the hardware logic) to the state data that is, per the original design, expected to be output by the simulator and use this comparison to update the hardware logic and assess the functionality and validity of each hardware update.

Figure 4:
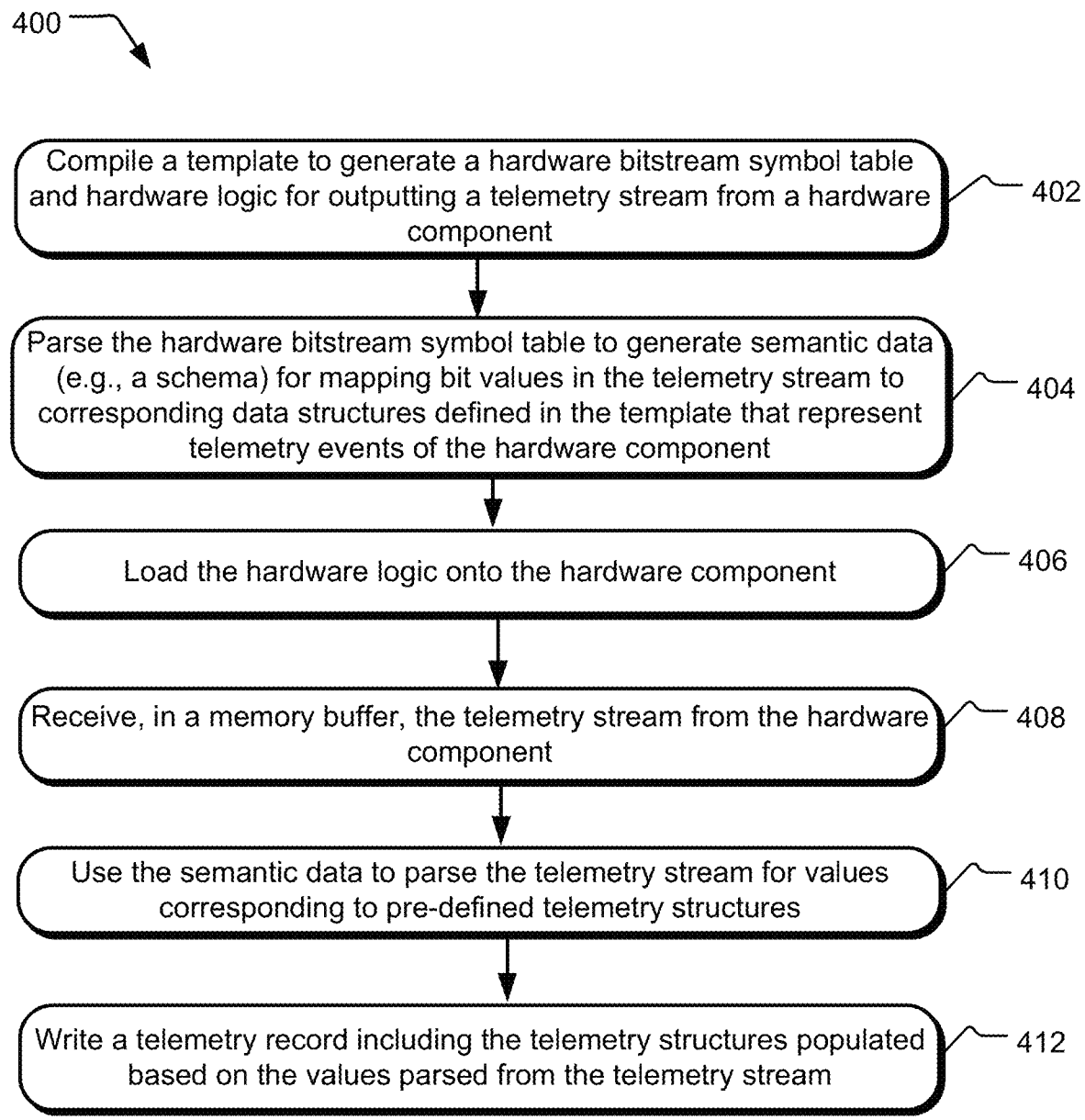
FIG. 4 illustrates example operations for generating and capturing telemetry for in-the-field hardware testing.

FIG. 4 illustrates example operations 400 for generating and capturing telemetry for in-the-field hardware testing. A compilation operation 402 compiles a template that acts on a defined telemetry structure to generate a hardware bitstream symbol table and hardware logic executable to cause a hardware component (e.g., an FPGA or other component that does not execute software) to output a telemetry stream. A parsing operation 404 parses the hardware bitstream symbol table to generate semantic data (e.g., a schema) for mapping bit values in the telemetry stream to corresponding data structures defined in the template that representing telemetry events of the hardware component. A loading operation 406 loads the hardware logic onto the hardware component. A receiving operation 408 receives, in a memory buffer, the telemetry stream from the hardware component. A schema population operation 410 executes a driver that uses the semantic data to parse the telemetry stream for values corresponding to the telemetry structures acted upon by the template to generate the hardware logic. A writing operation 412 writes a telemetry record including the telemetry structures populated based on the values parsed from the telemetry stream.

Figure 5:
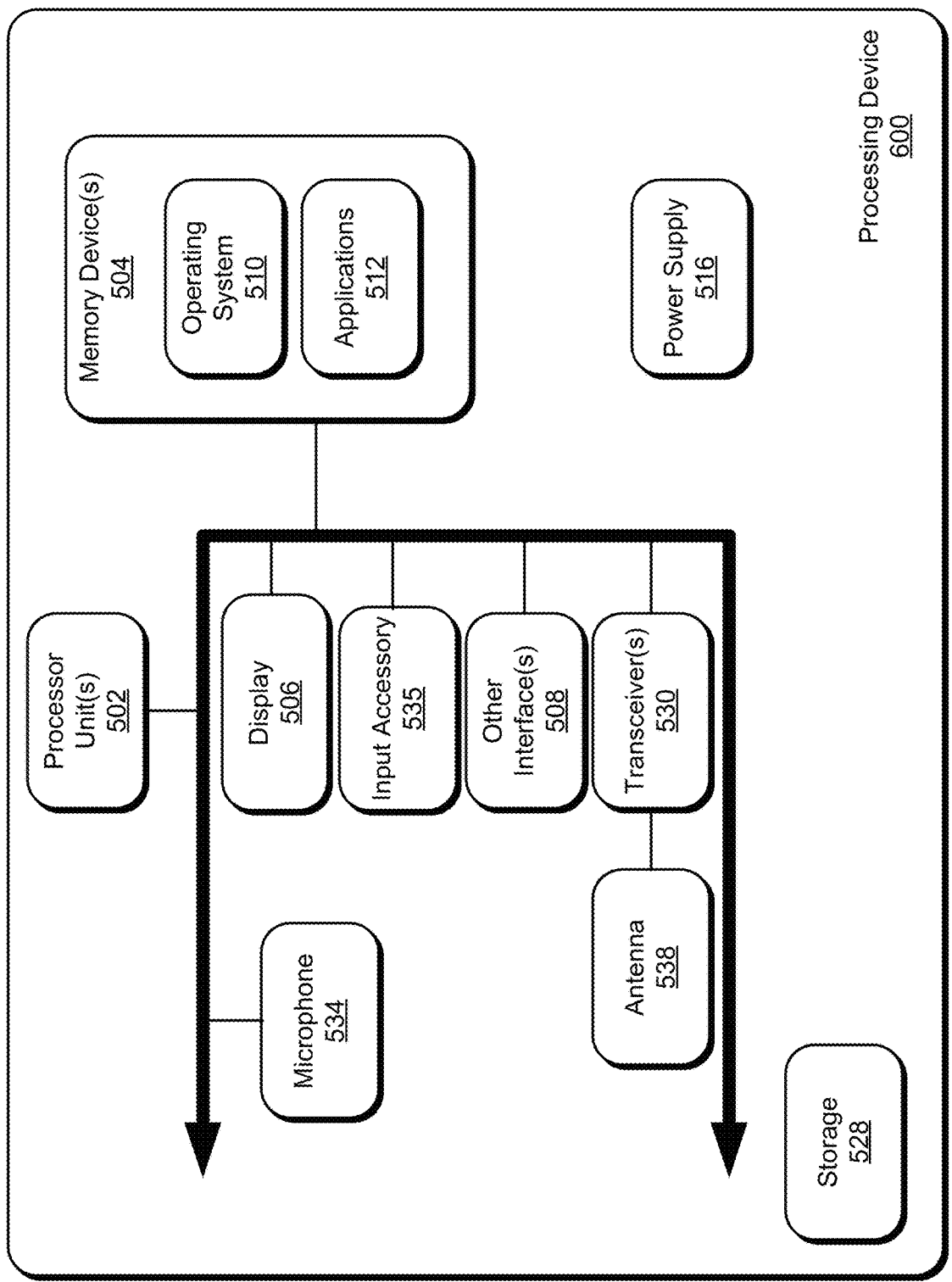
FIG. 5 illustrates an example schematic of a processing device suitable for implementing aspects of the disclosed technology.

FIG. 5 illustrates an example schematic of a processing device 500 suitable for implementing aspects of the disclosed technology. The processing device 500 includes one or more processor unit(s) 502, memory 504, a display 506, and other interfaces 508 (e.g., buttons). The processor unit(s) 502 may include one or more processors for executing software (CPUs or GPUs) on or more ICs such as an ASIC or FPGA. The memory 504 generally includes both volatile memory (e.g., RAM) and non-volatile memory (e.g., flash memory). An operating system 510, such as the Microsoft Windows® operating system, the Microsoft Windows® Phone operating system or a specific operating system designed for a gaming device, resides in the memory 504 and is executed by the processor unit(s) 502, although it should be understood that other operating systems may be employed.

One or more applications 512, such as the IC driver 110 of FIG. 1, are loaded in the memory 504 and executed on the operating system 510 by the processor unit(s) 502. Applications 512 may receive input from various input local devices such as a microphone 534 or input accessory 535 (e.g., keypad, mouse, stylus, touchpad, gamepad, racing wheel, joystick). Additionally, the applications 512 may receive input from one or more remote devices, such as remotely-located smart devices, by communicating with such devices over a wired or wireless network using more communication transceivers 530 and an antenna 538 to provide network connectivity (e.g., a mobile phone network, Wi-Fi®, Bluetooth®). The processing device 500 may also include various other components, such as a positioning system (e.g., a global positioning satellite transceiver), one or more accelerometers, one or more cameras, an audio interface (e.g., the microphone 534, an audio amplifier and speaker and/or audio jack), and storage devices 528. Other configurations may also be employed.

The processing device 500 further includes a power supply 516, which is powered by one or more batteries or other power sources and which provides power to other components of the processing device 500. The power supply 516 may also be connected to an external power source (not shown) that overrides or recharges the built-in batteries or other power sources. In an example implementation, the processor units 502 include an FPGA and the applications 512 include an IC driver (e.g., IC driver 110 in FIG. 1).

The processing device 500 may include a variety of tangible computer-readable storage media and intangible computer-readable communication signals. Tangible computer-readable storage can be embodied by any available media that can be accessed by the processing device 500 and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information, and which can be accessed by the processing device 500. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Some implementations may comprise an article of manufacture. An article of manufacture may comprise a tangible storage medium (a memory device) to store logic. Examples of a storage medium may include one or more types of processor-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described implementations. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain operation segment. The instructions may be implemented using any suitable high-level, low-level, object-oriented, visual, compiled and/or interpreted programming language.

An example method disclosed herein provides for receiving a telemetry stream from a hardware component responsive to execution of hardware logic within the hardware component; populating telemetry structures defined within a telemetry event schema based on values parsed from the telemetry stream; and writing a telemetry record to memory of the computing device. The telemetry structures represent logical states of the hardware component, and the telemetry record includes the populated telemetry structures.

Another example method according to any preceding method further provides for instantiating a template to act on a defined telemetry structure to generate a class instance, the telemetry structures each representing at least one telemetry event of the hardware component; compiling the class instance to generate a hardware bitstream symbol table and the hardware logic; loading the hardware logic onto the hardware component; parsing the hardware bitstream symbol table to generate the telemetry event schema; and storing, in memory of the computing device, a driver including instructions for generating the telemetry record using the telemetry event schema.

In yet still another example method of any preceding method, the hardware logic emits the telemetry stream as a first-in, first-out (FIFO) structure.

In yet still another example method of any preceding method, writing the telemetry record further comprises writing the telemetry record to non-volatile memory of the computing device that includes the hardware component.

In still another example method of any preceding method, the method further provides for migrating the telemetry record to a remote database storing other telemetry records collected responsive to execution of the hardware logic within other hardware components on different computing devices.

In yet still another example method of any preceding method, the method further provides for querying the remote database for a select value associated with a telemetry structure defined within the telemetry event schema; and receiving from the database values observed in association with the telemetry structure on each of the different computing devices.

In yet still another example method of any preceding method, the hardware component is a reprogrammable chip and the method further comprises deploying an update to a hardware configuration of the reprogrammable chip on each of the different computing devices based on values received from the remote database.

In still another example method of any preceding method, the hardware component is a field-programmable gate array.

An example system disclosed herein includes a hardware component encoded with hardware logic for emitting a telemetry stream into a telemetry buffer within memory of a computing device and a hardware component driver stored in the memory and configured to parse the telemetry stream; populate telemetry structures defined within a telemetry event schema based on values parsed from the telemetry stream, and generate a telemetry record including the populated telemetry structures. The telemetry structures represent logical states of the hardware component.

In another example system of any preceding system, the system further includes a compiler and a telemetry schema generator. The compiler is stored in memory and configured to generate a hardware bitstream symbol table and the hardware logic based on at least one defined telemetry structure representing a telemetry event of the hardware component. The telemetry schema generator is stored in memory and executable to parse the hardware bitstream symbol table to generate the telemetry event schema.

In still another example system of any preceding system, the hardware logic emits the telemetry stream as a first-in, first-out (FIFO) structure.

In yet still another example system of any preceding system, the hardware component driver is further configured to write the telemetry record to non-volatile memory of the computing device that includes the hardware component.

In still another example system of any preceding system, the hardware component driver is further configured migrate the telemetry record to a remote database storing other telemetry records collected responsive to execution of the hardware logic within other hardware components on different computing devices.

In yet still another example system of any preceding system, the hardware component is a field-programmable gate array.

An example memory device disclosed herein encodes computer-executable instructions for executing a computer process that includes generating a hardware bitstream symbol table and hardware logic based on at least one defined telemetry structure representing a logical state of a hardware component. The hardware logic is executable to cause the hardware component to emit a telemetry stream. The computer process further includes parsing the hardware bitstream symbol table to generate a telemetry event schema for mapping bit values in the telemetry stream to field values of the defined telemetry structure; and autonomously generating a driver including computer-executable instructions for reading the telemetry stream emitted from the hardware component; populating the telemetry event schema based on values parsed from the telemetry stream; and writing a telemetry record including the populated telemetry event schema.

In another example memory device of any preceding memory device, the hardware component is a field-programmable gate array.

In still another example memory device of any preceding memory device, the hardware logic emits the telemetry stream as a first-in, first-out (FIFO) structure.

In yet still another example memory device of any preceding memory device, the telemetry stream is stored in RAM.

In yet still another example memory device of any preceding memory device, the driver is further executable to migrate the telemetry record to a remote database storing other telemetry records collected responsive to execution of the hardware logic within other hardware components on different computing devices.

In another example memory device according to any preceding memory device, the hardware component does not execute software.

An example system disclosed herein includes a means for receiving a telemetry stream from a hardware component responsive to execution of hardware logic within the hardware component, a means for populating telemetry structures defined within a telemetry event schema based on values parsed from the telemetry stream, and a means for writing a telemetry record to memory of the computing device. The telemetry structures represent logical states of the hardware component and the telemetry record includes the populated telemetry structures.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. A method comprising:
   generating a hardware bitstream symbol table and hardware logic based on at least one defined telemetry structure representing a logical state of a hardware component, the hardware logic executable to cause the hardware component to emit a telemetry stream;
   parsing the hardware bitstream symbol table to generate a telemetry event schema for mapping bit values in the telemetry stream to field values of the at least one defined telemetry structure;
   generating a driver configured to:
      read the telemetry stream output from the hardware component responsive to execution of the hardware logic within the hardware component;
      populate telemetry structures within the telemetry event schema based on the bit values parsed from the telemetry stream; and
      write a telemetry record to a memory of a computing device, the telemetry record including the populated telemetry structures.

2. The method of claim 1 comprising:
   instantiating a template to act on the at least one defined telemetry structure to generate a class instance, the at least one defined telemetry structure representing at least one telemetry event of the hardware component;
   compiling the class instance to generate the hardware bitstream symbol table and the hardware logic;
   loading the hardware logic onto the hardware component; and
   storing, in the memory of the computing device, the driver.

3. The method of claim 1, wherein the hardware logic emits the telemetry stream as a first-in, first-out (FIFO) structure.

4. The method of claim 1, where writing the telemetry record further comprises:
   writing the telemetry record to non-volatile memory of the computing device that includes the hardware component.

5. The method of claim 1, further comprising:
   migrating the telemetry record to a remote database storing other telemetry records collected responsive to execution of the hardware logic within other hardware components on different computing devices.

6. The method of claim 5, further comprising:
   querying the remote database for a select value associated with a telemetry structure defined within the telemetry event schema;
   receiving from the remote database values observed in association with the telemetry structure on each of the different computing devices.

7. The method of claim 6, wherein the hardware component is a reprogrammable chip and the method further comprises:
   deploying an update to a hardware configuration of the reprogrammable chip on each of the different computing devices based on the values received from the remote database.

8. The method of claim 1, wherein the hardware component is a field-programmable gate array.

9. A system comprising:
   a compiler stored in a memory of a computing device and configured to generate a hardware bitstream symbol table and hardware logic based on at least one defined telemetry structure representing a telemetry event of a hardware component, the hardware logic being executable to cause the hardware component to emit a telemetry stream into a telemetry buffer within the memory of the computing device;
   a telemetry schema generator stored in the memory of the computing device and executable to parse the hardware bitstream symbol table to generate a telemetry event schema;
   a hardware component driver stored in the memory and configured to:
      parse the telemetry stream;
      populate telemetry structures within the telemetry event schema based on bit values parsed from the telemetry stream; and
      generate a telemetry record including the populated telemetry structures.

10. The system of claim 9, wherein the hardware logic emits the telemetry stream as a first-in, first-out (FIFO) structure.

11. The system of claim 9, wherein the hardware component driver is further configured to write the telemetry record to non-volatile memory of the computing device that includes the hardware component.

12. The system of claim 9, wherein the hardware component driver is further configured to migrate the telemetry record to a remote database storing other telemetry records collected responsive to execution of the hardware logic within other hardware components on different computing devices.

13. The system of claim 9, wherein the hardware component is a field-programmable gate array.

14. One or more memory devices encoding computer-executable instructions for executing a computer process comprising:
   generating a hardware bitstream symbol table and hardware logic based on at least one defined telemetry structure representing a logical state of a hardware component, the hardware logic executable to cause the hardware component to emit a telemetry stream;
   parsing the hardware bitstream symbol table to generate a telemetry event schema for mapping bit values in the telemetry stream to field values of the at least one defined telemetry structure;
   autonomously generating a driver, the driver configured to:
      read the telemetry stream emitted from the hardware component;
      populate telemetry structures within the telemetry event schema based on the bit values parsed from the telemetry stream; and
      write a telemetry record including the populated telemetry structures.

15. The one or more memory devices of claim 14, wherein the hardware component is a field-programmable gate array.

16. The one or more memory devices of claim 14, wherein the hardware logic emits the telemetry stream as a first-in, first-out (FIFO) structure.

17. The one or more memory devices of claim 14, wherein the telemetry stream is stored in random access memory (RAM).

18. The one or more memory devices of claim 14, wherein the driver is further executable to:
   migrate the telemetry record to a remote database storing other telemetry records collected responsive to execution of the hardware logic within other hardware components on different computing devices.

19. The one or more memory devices of claim 18, wherein the hardware component does not execute software.

* * * * *